United States Patent [19]
Liu et al.

[11] Patent Number: 6,130,157
[45] Date of Patent: Oct. 10, 2000

[54] METHOD TO FORM AN ENCAPSULATION LAYER OVER COPPER INTERCONNECTS

[75] Inventors: Chung-Shi Liu; Chen-Hua Yu, both of Hsin-Chu, Taiwan

[73] Assignee: Taiwan Semiconductor Manufacturing Company, Hsin-Chu, Taiwan

[21] Appl. No.: 09/356,005

[22] Filed: Jul. 16, 1999

[51] Int. Cl.$^7$ .................................................. H01L 21/44
[52] U.S. Cl. ........................ 438/669; 438/624; 438/633; 438/637; 438/653; 438/656; 438/671; 438/672; 438/683; 438/685; 427/305; 427/355; 427/427; 427/443.1
[58] Field of Search ................................. 438/624, 633, 438/637, 671, 669, 672, 653, 656, 683, 685; 427/98, 305, 355, 427, 443.1; 428/432, 433, 688

[56] References Cited

U.S. PATENT DOCUMENTS

| | | | |
|---|---|---|---|
| 5,277,985 | 1/1994 | Li et al. | 428/432 |
| 5,403,779 | 4/1995 | Joshi et al. | 437/190 |
| 5,412,250 | 5/1995 | Brugge | 257/750 |
| 5,447,887 | 9/1995 | Filipiak et al. | 437/200 |
| 5,744,376 | 4/1998 | Chan et al. | 437/190 |
| 5,814,557 | 9/1998 | Venkatraman et al. | 438/622 |
| 5,817,572 | 10/1998 | Chiang et al. | 438/624 |
| 5,821,168 | 10/1998 | Jain | 438/692 |
| 5,891,513 | 4/1999 | Dubin et al. | 427/98 |
| 5,913,141 | 8/1998 | Bothra | 438/625 |

OTHER PUBLICATIONS

Lanford et al., "Law Temperature Passivation of Copper by Doping with Al or Mg," Thin Solic Films 262 (1995), pp. 234–241.

Awaya et al., "Self–Aligned Passivation Technology for Copper Interconnection using Copper–Aluminum Alloy", Japanese Journal of Applied Physics, vol. 36, (1997), pp. 1548–1553.

Krishnan et al, "Copper Metallization for VLSI Applications", VMIC Conference Jun. 9–10, 1992, pp. 226–231.

E.G. Colgan, Selective CVD–W for Capping Damascene Cu Lines, Thin Solid Films, 262, (1995), pp. 120–123.

*Primary Examiner*—David Nelms
*Assistant Examiner*—Renee' R Berry
*Attorney, Agent, or Firm*—George O. Saile; Stephen B. Ackerman; Rosemary L. S. Pike

[57] ABSTRACT

A method to form copper interconnects with an improved encapsulation layer is achieved. A substrate layer is provided. Conductive traces are provided overlying the substrate layer. A first intermetal dielectric layer is deposited overlying the conductive traces. The first intermetal dielectric layer is etched through to the underlying conductive traces where the first intermetal dielectric layer is not protected by a photoresist mask to form interconnect trenches. A barrier layer is deposited overlying the first intermetal dielectric layer and exposed the conductive traces. A copper layer is deposited overlying the barrier layer and filling the interconnect trenches. The copper layer and the barrier layer are polished down to the top surface of the first intermetal dielectric layer to define copper interconnects. An encapsulation layer is formed overlying the copper interconnects wherein the encapsulation layer is not formed overlying the first intermetal interconnect layer and wherein the encapsulation layer is at least partially comprised of tungsten nitride. A second intermetal dielectric layer is deposited and the fabrication of the integrated circuit device is completed.

20 Claims, 4 Drawing Sheets

METHOD TO FORM AN ENCAPSULATION LAYER OVER COPPER INTERCONNECTS

BACKGROUND OF THE INVENTION

(1) Field of the Invention

The present invention relates to the fabrication of semiconductor structures, and more particularly, to a method to form an encapsulation layer over copper interconnects in the manufacture of integrated circuits.

(2) Description of the Prior Art

As integrated circuit feature sizes continue to decrease, it has become advantageous to construct metal connections out of copper instead of aluminum. Copper has a lower resistivity than aluminum, and therefore can form higher speed connections for a given line width.

Copper has disadvantages when compared to aluminum that must be overcome. For example, copper is much more susceptible to oxidation during processing. Copper also tends to diffuse into adjacent materials, including dielectrics. To use copper for interconnections, therefore, it is necessary to encapsulate the copper in barrier materials.

Where a low resistive interface between a copper interconnect and an underlying metal conductor must be completed, it is common in the art to deposit a barrier of a metal material, such as titanium, tungsten, or tantalum, before the copper layer is deposited. After the copper layer is deposited, another barrier layer, typically called an encapsulation layer is deposited overlying the copper. Typically in the art, this encapsulation layer is composed of silicon nitride, though other materials are used.

Referring to FIG. 1, a cross-section of a partially completed prior art copper interconnect structure is shown. The structure shown is a damascene feature where the trench for the connective trace is created before the me al layer is deposited. A substrate layer 10 is depicted. The substrate layer 10 encompasses all underlying layers, devices, Junctions, and other features that have been formed prior to the deposition and definition of a metal trace 14. A first intermetal dielectric layer 18 overlies the metal trace 14.

A via opening is shown formed in the first intermetal dielectric layer 18 to expose the top surface of the conductive trace 14. A barrier layer 22 is deposited overlying the first dielectric layer 18 and the exposed conductive traces 14. The purpose of the barrier layer 22 is to prevent diffusion of the subsequently deposited copper into the conductive traces 14 or into the first intermetal dielectric layer 18. A copper layer 24 has been deposited overlying the first intermetal dielectric layer 18 and filling the via opening. The excess copper layer 24 and the excess barrier layer 22 are then typically polished down to the first intermetal dielectric layer 18 by a chemical mechanical polish (CMP).

Following the definition of the copper traces by the CMP, an encapsulation layer 28 is deposited. This encapsulation layer 28 serves as a barrier to diffusion of the copper layer 24 into any overlying layers. In addition, by encapsulating the copper completely in the barrier layer 22 and the encapsulation layer 28, oxidation during subsequent processing is eliminated.

The problem with the prior art approach of encapsulating with silicon nitride is the large dielectric constant of this material. This means that the encapsulation layer 28 is adding a significant amount of capacitance loading to the copper interconnect node. Added capacitance is detrimental to very high switching speed operation.

Other materials and techniques are used in the art to create the encapsulation layer, but each has deficiencies. For example, as disclosed by Awaya and Kobayashi in *Japanese Journal of Applied Physics*, 36, Pt.1, (1997), p. 1548, aluminum may also be used as an encapsulation layer. First, aluminum is deposited overlying the copper layer by physical vapor deposition (PVD). Then an annealing operation is used to form an aluminum and copper alloy. Finally, a selective etch is performed to remove excess aluminum. The main problem with this approach is that some of the copper layer is consumed in the process of creating the alloy. This increases the resistance of the copper runner and is detrimental to high speed switching.

Another approach used to form the encapsulation layer is barrier diffusion, as taught in Lanford, et al, *Thin Solid Films*, 262, (1995), p. 234. In this technique, a thermal process is used to diffuse out some of the barrier layer material. This material is then re-deposited during the thermal process onto the copper layer to form the encapsulation layer. The problem with this approach is that while the encapsulation layer so formed performs well as an oxidation barrier, it does not perform well as a diffusion barrier.

Titanium nitride is disclosed as an encapsulation barrier in Krishnan et al in *VMIC* (1992), p. 226. Following copper CMP, a layer of about 500 Angstroms to 800 Angstroms of Titanium Nitride is deposited overlying the copper layer by chemical vapor deposition (CVD). The problem with this technique is that an additional CMP step is required to remove the excess TiN because the deposition is not selective to only the copper layer.

Tungsten is used as an encapsulation layer in the reference by Colgan, *Thin Solid Films*, 262, (1995), p. 120. Following the CMP and cleaning of the copper layer, a tungsten layer is selectively deposited by CVD to overlie only the copper layer. The problem with the this approach is that a thickness of about 750 Angstroms is required to provide an adequate barrier to diffusion and oxidation of copper. To achieve the desired planarity from the copper interconnect process, the encapsulation layer must be made much thinner.

Several prior art approaches also deal with copper encapsulation methods. U.S. Pat. No. 5,403,779 to Joshi et al teaches a process to form damascene metal lines and vias. After copper deposition, Tungsten is deposited by CVD. A CMP step is performed to planarize the structures. U.S. Pat. No. 5,447,887 to Filipiak et al discloses a process to form copper interconnects where a copper silicide layer is formed overlying the copper traces. A silicon nitride layer is deposited overlying the copper silicide to complete the encapsulation layer. U.S. Pat. No. 5,814,557 to Venkatraman et al discloses a process to form a coppercontaining aluminum film overlying an aluminum conductor. An annealing operation is performed to diffuse the copper into the aluminum conductor. U.S. Pat. No. 5,744,376 to Chen et al recites an encapsulation layer deposited over a copper plug. U.S. Pat. No. 5,412,250 to Brugge teaches a method to form an enhanced barrier layer underlying the copper conductor. A titanium layer is deposited and then exposed to nitrogen gas to improve characteristics. U.S. Pat. No. 5,821,168 to Jain discloses the formation of silicon oxynitride as a barrier layer underlying copper traces in a dual damascene process.

SUMMARY OF THE INVENTION

A principal object of the present invention is to provide an effective and very manufacturable method of fabricating integrated circuits with copper interconnects.

A further object of the present invention is to provide a method of fabricating copper interconnects with an improved encapsulation layer.

A yet further object of the present invention is to provide a method of fabricating copper interconnects with an improved encapsulation layer that is at least partially comprised of tungsten nitride.

A still further object of the present invention is to provide a method of fabricating copper interconnects with an improved encapsulation layer that is comprised of tungsten and tungsten nitride.

Another further object of the present invention is to provide a method of fabricating copper interconnects with an improved encapsulation layer comprised of tungsten nitride.

Yet another object of the present invention is to provide a method of fabricating copper interconnects with an improved encapsulation layer that is selectively deposited only overlying the copper interconnect and therefore requires no subsequent polishing down step.

Yet another object of the present invention is to provide a method of fabricating copper interconnects with a thinner encapsulation layer that effectively prevents copper oxidation and diffusion.

Another still yet further object of the present invention is to provide a method of fabricating copper interconnects with a thinner encapsulation layer that does not require a further planarization process.

In accordance with the objects of this invention, a new method of fabricating an integrated circuit with copper interconnects using an improved encapsulation layer made of a composite of tungsten and tungsten nitride is achieved. A substrate layer is provided encompassing all underlying layers, devices, and junctions. Conductive traces are provided overlying the substrate layer. A first intermetal dielectric layer is deposited overlying the conductive traces. The first intermetal dielectric layer is patterned to form interconnect trenches. A barrier layer is deposited overlying the first intermetal dielectric layer and the exposed conductive traces. A copper layer is deposited overlying the barrier layer and filling the interconnect trenches. The copper layer and the barrier layer are polished down to the top surface of the first intermetal dielectric layer to thereby define the copper interconnects. A tungsten layer is selectively deposited overlying only the copper layer and the barrier layer. The tungsten layer is treated to form a tungsten nitride layer in the tungsten layer to thereby complete the encapsulation layer. A second intermetal dielectric layer is deposited overlying the first intermetal dielectric layer and the encapsulation layer to complete the fabrication of the integrated circuit device.

Also in accordance with the objects of this invention, a new method of fabricating an integrated circuit with copper interconnects using an improved encapsulation layer made of tungsten nitride is achieved. A substrate layer is provided encompassing all underlying layers, devices, and junctions. Conductive traces are provided overlying the substrate layer. A first intermetal dielectric layer is deposited overlying the conductive traces. The first intermetal dielectric layer is patterned to form interconnect trenches. A barrier layer is deposited overlying the first intermetal dielectric layer and the exposed conductive traces. A copper layer is deposited overlying the barrier layer and filling the interconnect trenches. The copper layer and the barrier layer are polished down to the top surface of the first intermetal dielectric layer to thereby define the copper interconnects. A tungsten nitride layer is selectively deposited overlying only the copper layer and the barrier layer to thereby form the encapsulation layer. A second intermetal dielectric layer is deposited overlying the encapsulation layer to complete the fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
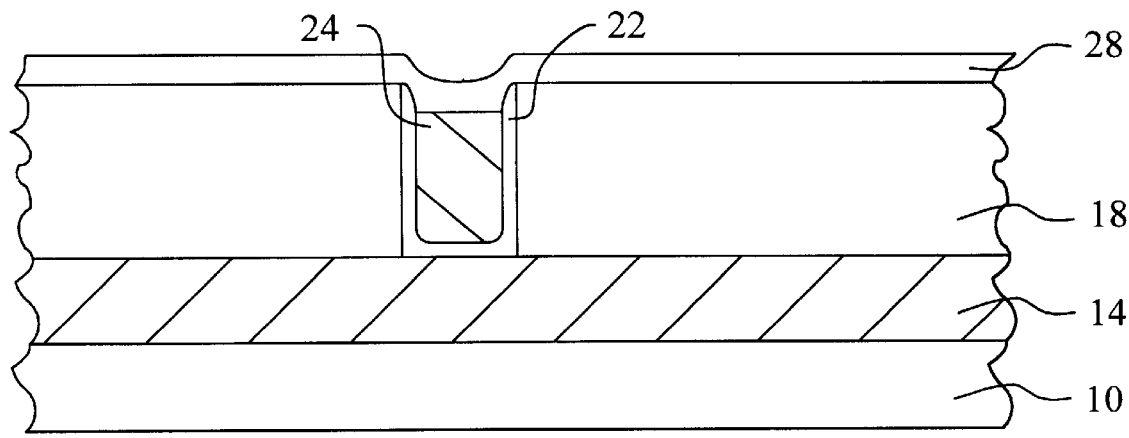
FIG. 1 schematically illustrates in cross-section a partially completed prior art integrated circuit using copper interconnect structures.
Figure 2:
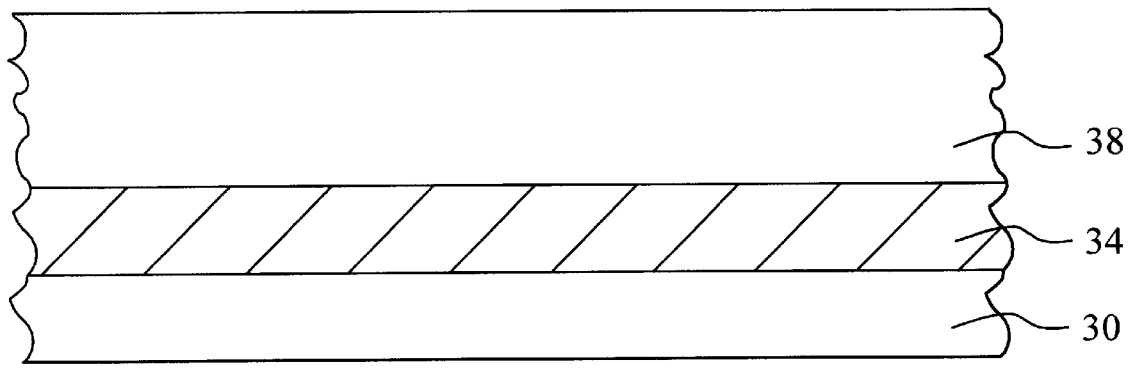
FIGS. 2 through 6 schematically illustrate in cross-sectional representation the present invention used to create copper interconnects.

Referring now more particularly to FIG. 2, there is illustrated a portion of a partially completed integrated circuit. In the preferred embodiments, the present invention will be used to create copper interconnects. It will be understood by those skilled in the art that the invention could be applied to the formation of other copper structures. Substrate 30 encompasses all underlying layers, devices, junctions, and other features. Conductive traces 34 are provided overlying the substrate layer as conventional in the art. A first intermetal dielectric layer 38 is deposited overlying the conductive traces 34. The first intermetal dielectric layer 38 is preferably composed of an oxide such as a low k-value fluorinated silicate glass (FSG) which is planarized after deposition. Preferably, the first intermetal dielectric layer 38 is deposited to a thickness of between about 4,000 Angstroms and 10,000 Angstroms.

Figure 3:
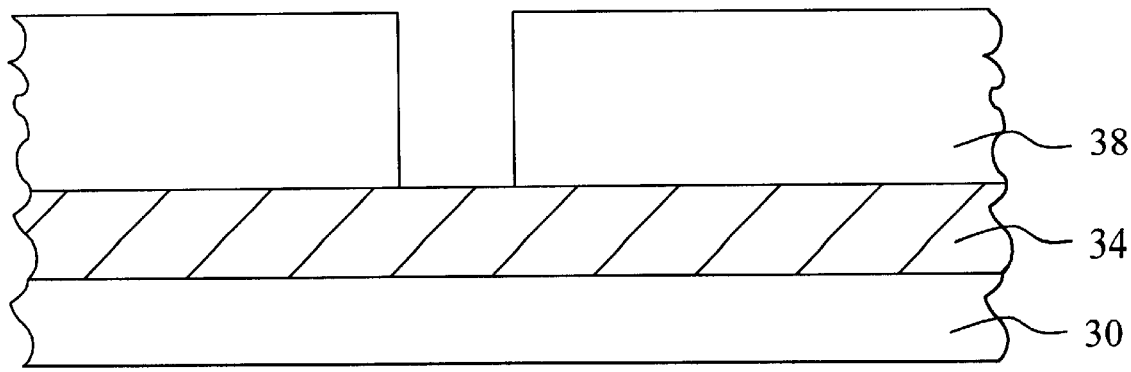

Referring now to FIG. 3, the first intermetal dielectric layer 38 is etched through to the underlying conductive traces 34 where the first intermetal dielectric layer 38 is not protected by a photoresist mask which is not shown. This etching step forms interconnect trenches in the first intermetal dielectric layer 38. The interconnect trenches are etched by a conventional reactive ion etch (RIE).

Figure 4:
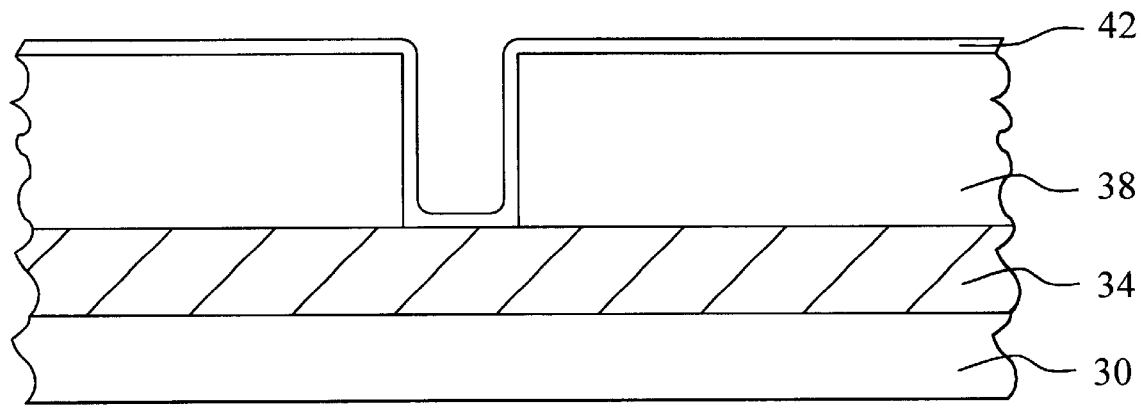

Referring now to FIG. 4, a barrier layer 42 is deposited overlying the first intermetal dielectric layer 38 and the exposed conductive traces 34. The purpose of the barrier layer 42 is to prevent oxidation and diffusion of the subsequently deposited copper metal layer while still providing a low resistance contact path between the conductive traces 34 and the subsequently formed copper interconnects. The barrier layer 42 may be composed of any of several metals such as tantalum (Ta), titanium (Ti), or tungsten (W), or nitrides such as titanium nitride (TiN), tantalum nitride (TaN), and tungsten nitride (WN). The barrier layer 42 is deposited to a thickness of between about 100 Angstroms and 500 Angstroms.

Figure 5:
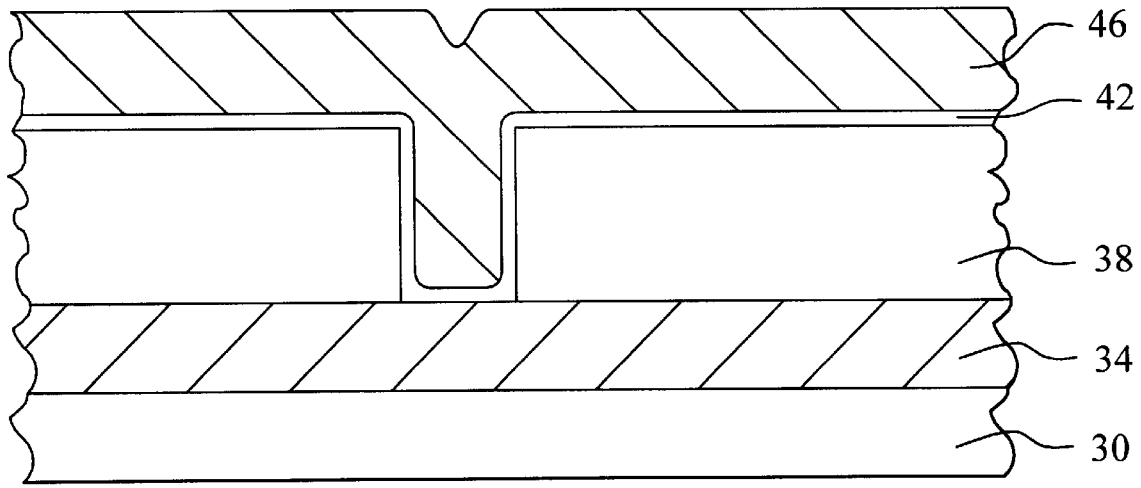

Referring to FIG. 5, a copper layer 46 is deposited overlying the barrier layer 42. Typically, a seed layer is first deposited using physical vapor deposition (PVD) or chemical vapor deposition (CVD). Then the copper layer 46 is deposited by electrochemical plating over the seed layer. The copper layer 46 is deposited to a thickness of between about 5,000 Angstroms and 15,000 Angstroms.

Figure 6:
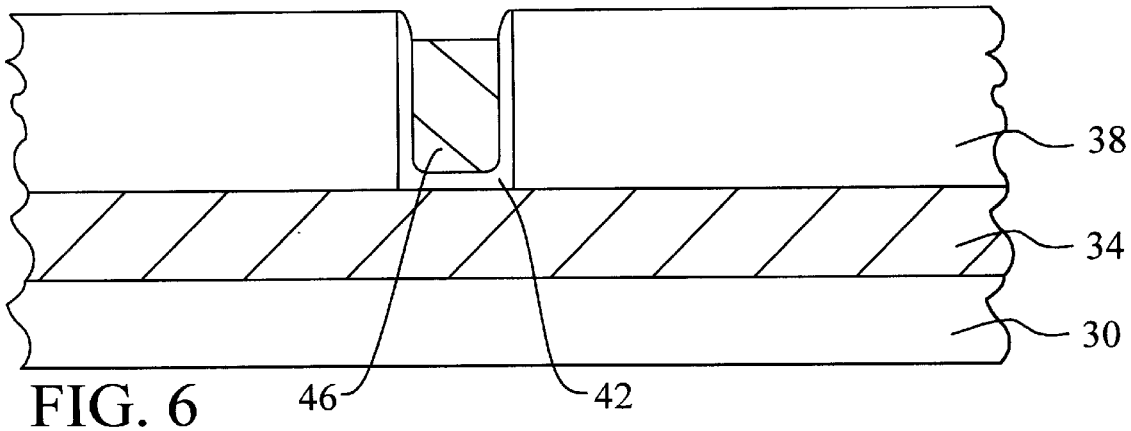

Referring now to FIG. 6, the copper layer and the barrier layer are polished down to the top surface of the first intermetal dielectric layer to thereby define the copper interconnects. The polishing operation is conventionally completed using a chemical mechanical polishing (CMP) process. Following the CMP process, a plasma clean, using $H_2$ or $NH_3$, is then typically performed to reduce copper oxides on the surface of the copper layer 46.

Figure 7:
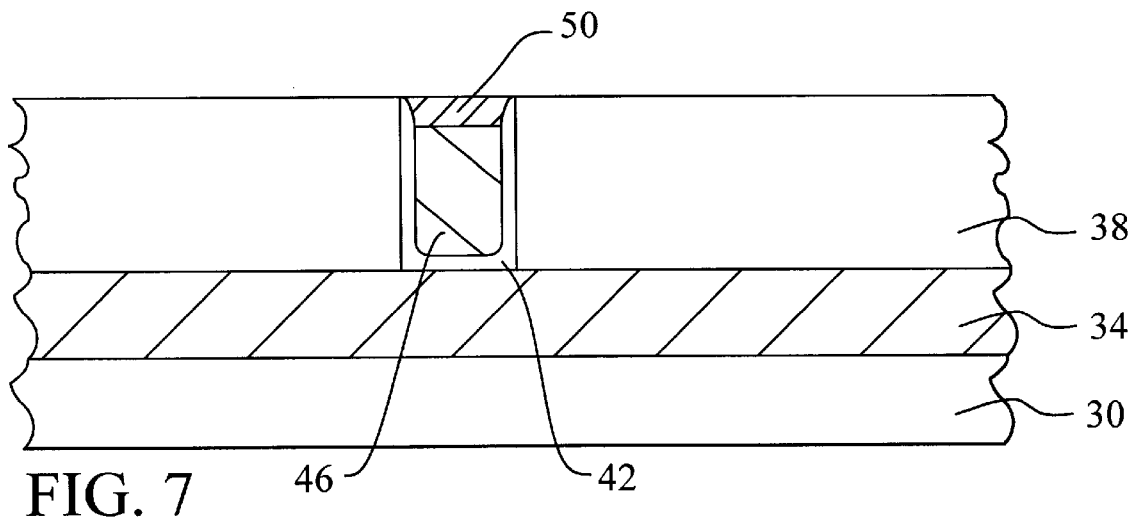
FIGS. 7 through 9 schematically illustrate in cross-sectional representation a first embodiment of the present invention.

Referring now to FIG. 7, an important feature of the first embodiment of the present invention is illustrated. A tungsten layer 50 is selectively deposited overlying only the copper layer 46 and the barrier layer 42. The tungsten layer 50 is deposited by chemical vapor deposition (CVD) preferably using a $WF_6$ partial pressure of between about 5 milliTorr and 20 milliTorr, a total pressure of between about 50 milliTorr and 200 milliTorr, and a temperature of between about 200 degrees C. and 400 degrees C. The tungsten layer 50 so formed has a thickness of between about 300 Angstroms and 1,000 Angstroms. The tungsten deposition is described by:

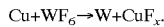

Because the tungsten layer 50 is selectively deposited only overlying the copper interconnects and the barrier layer, but not overlying the first intermetal dielectric layer 38, a subsequent etch back or CMP step to remove excess tungsten is not necessary.

Figure 8:
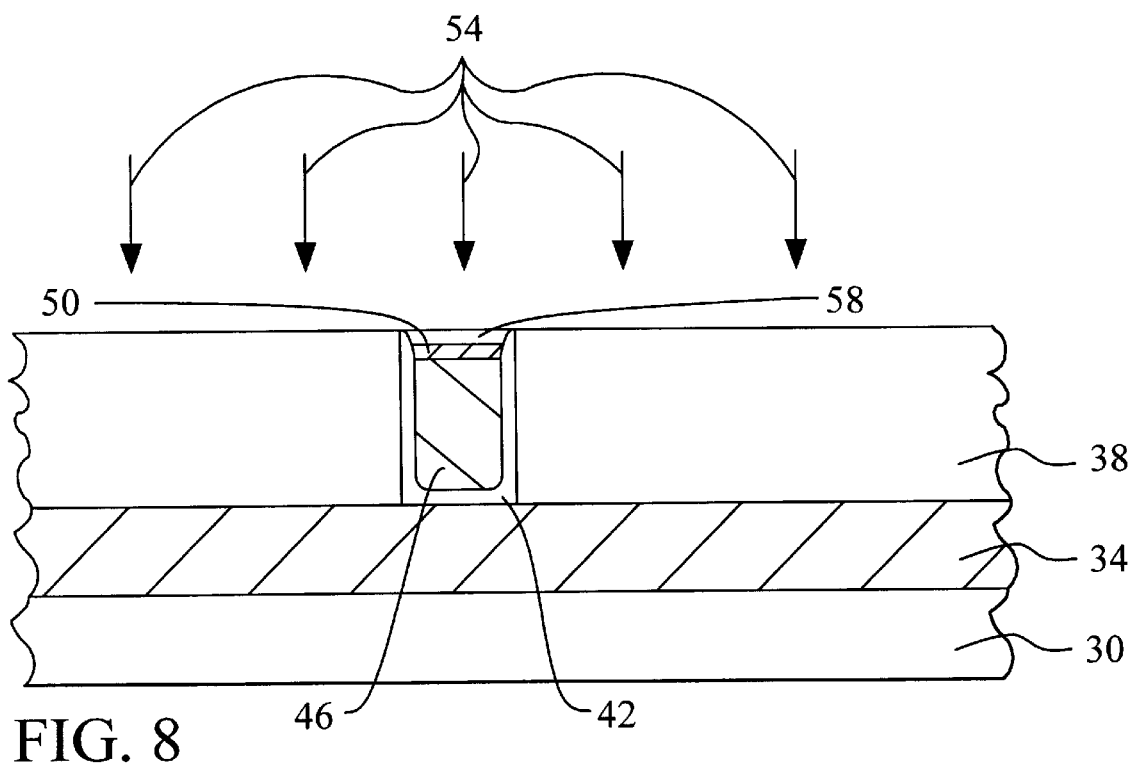

Referring now to FIG. 8, another important aspect of the first embodiment of the present invention is shown. The tungsten layer 50 is treated 54 to form a tungsten nitride layer 58 in the tungsten layer 50. The encapsulation layer is thereby formed. The treatment 54 mechanism is to expose the wafer to a nitrogen ($N_2$) plasma. Nitrogen bonds into the tungsten lattice to form a tungsten nitride ($WN_x$) layer 58 throughout the top surface of the tungsten layer 50. The tungsten nitride layer so formed has a thickness of between about 50 Angstroms and 200 Angstroms. The nitrogen plasma is created by flowing $N_2$ at between about 270 sccm and 330 sccm, at between about 360 degrees C. and 440 degrees C., and with an rf energy of between about 450 Watts and 550 Watts. The wafer is exposed to the nitrogen plasma treatment 54 for between about 27 seconds and 33 seconds.

Tungsten nitride ($WN_x$) is a better barrier to copper diffusion than tungsten. Copper can diffuse through elemental tungsten grain barriers at between 200 degrees C. and 300 degrees C. Addition of nitrogen to form tungsten nitride increases the diffusion threshold energy so that a temperature of above about 450 degrees C. is necessary for copper diffusion. By forming a tungsten nitride layer 58 in the tungsten layer 50, the encapsulation layer can be made thinner than if only tungsten was used. In this way, the resulting structure is kept nearly planar so that no special re-planarization processes need to be performed.

Figure 9:
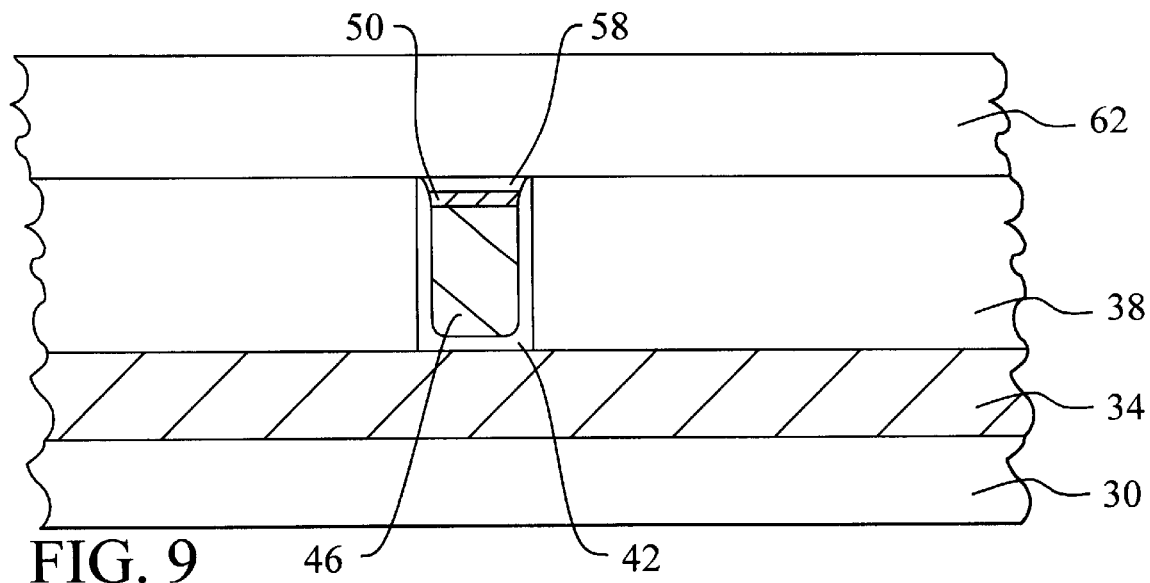

Referring now to FIG. 9, a second intermetal dielectric layer 62 is deposited overlying the first intermetal dielectric layer 38 and the encapsulation layer. The second intermetal dielectric layer 62 is preferably composed of an oxide such as a low k-value fluorinated silicate glass (FSG). This completes the fabrication of the integrated circuit device.

Figure 10:
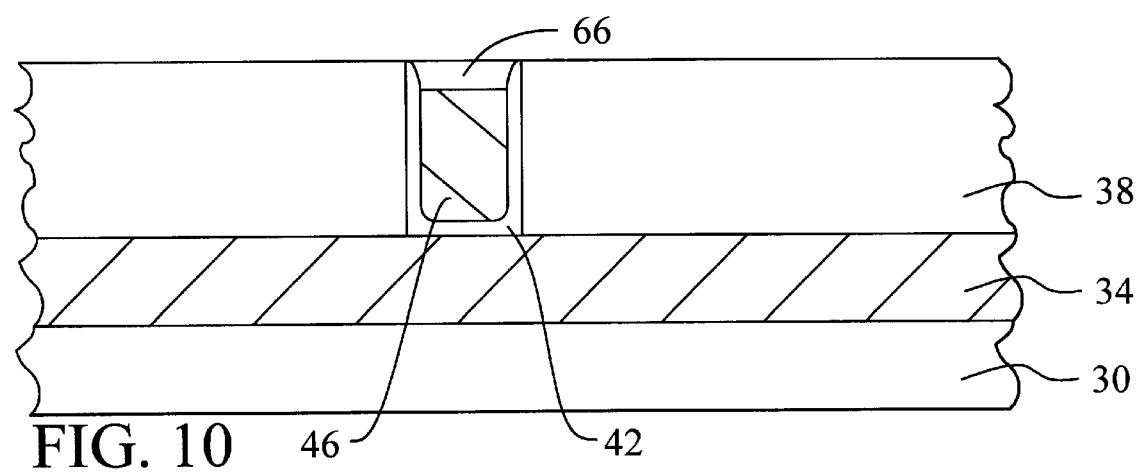
FIGS. 10 through 11 schematically illustrate in cross-sectional representation a second embodiment of the present invention.

Referring now to FIG. 10, a second embodiment of the present invention is illustrated. In an important element of this embodiment, a tungsten nitride layer 66 is selectively deposited overlying only the copper layer 46 and the barrier layer 42 to form the encapsulation layer. The tungsten nitride layer 66 is deposited by chemical vapor deposition (CVD) preferably using a $WF_6$ partial pressure of between about 5 milliTorr and 20 milliTorr, a nitrogen partial pressure of between about 5 milliTorr and 20 milliTorr, a total pressure of between about 50 milliTorr and 200 milliTorr, and a temperature of between about 200 degrees C. and 400 degrees C. The tungsten nitride layer 66 so formed has a thickness of between about 300 Angstroms and 1000 Angstroms. Because the tungsten nitride layer 66 is selectively deposited only overlying the copper layer 46 and the barrier layer 42 but not overlying the first intermetal dielectric layer 38, a subsequent etch back or CMP step to remove excess tungsten nitride is not necessary. Alternatively, $NH_3$ could be used instead of $N_2$ in the CVD process to form tungsten nitride.

As in the first embodiment, the encapsulation layer 66 composed of tungsten nitride ($WN_x$) forms a better barrier to copper diffusion than tungsten. Therefore, the encapsulation layer 66 can be made thinner than if only tungsten was used. In this way, the resulting structure is kept nearly planar so that no special re-planarization processes need to be performed.

Figure 11:
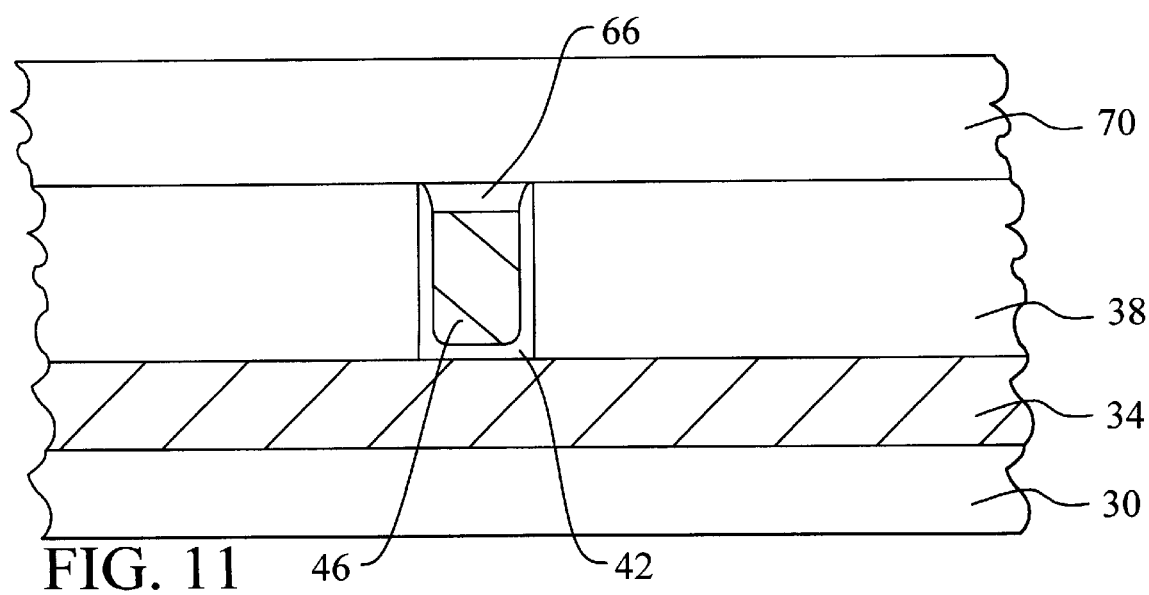

Referring now to FIG. 11, a second intermetal dielectric layer 70 is deposited overlying the first intermetal dielectric layer 38 and the encapsulation layer 66. The second intermetal dielectric layer 70 is preferably composed of an oxide such as a low k-value fluorinated silicate glass (FSG). This completes the fabrication of the integrated circuit device.

The process of the present invention provides a very manufacturable method for fabricating an encapsulation layer for copper interconnects in the fabrication of an integrated circuit device.

While the invention has been particularly shown and described with reference to the preferred embodiments thereof, it will be understood by those skilled in the art that various changes in form and details may be made without departing from the spirit and scope of the invention.

What is claimed is:

1. A method to form copper interconnects in the fabrication of an integrated circuit device comprising:

providing a semiconductor substrate;

providing conductive traces overlying said semiconductor substrate;

depositing a first intermetal dielectric layer overlying said conductive traces;

etching interconnect trenches through said first intermetal dielectric layer to said conductive traces;

depositing a barrier layer lining said interconnect trenches and overlying said exposed conductive traces;

depositing a copper layer overlying said barrier layer and filling said interconnect trenches;

polishing away said copper layer and said barrier layer to the top surface of said first intermetal dielectric layer and thereby defining copper interconnects;

selectively forming an encapsulation layer overlying said copper interconnects but not overlying said first intermetal interconnect layer wherein said encapsulation layer at least partially comprises tungsten nitride;

depositing a second intermetal dielectric layer overlying said first intermetal dielectric layer and said encapsulation layer; and completing the integrated circuit device.

2. The method according to claim 1 wherein said step of forming said encapsulation layer comprises:

selectively depositing a tungsten layer overlying said copper interconnects; and treating said tungsten layer to form said tungsten nitride layer.

3. The method according to claim 2 wherein said step of depositing said tungsten layer is by chemical vapor deposition (CVD) using a $WF_6$ partial pressure of between about 5 milliTorr and 20 milliTorr, a total pressure of between about 50 milliTorr and 200 milliTorr, and a temperature of between about 200 degrees C. and 400 degrees C.

4. The method according to claim 2 wherein said tungsten layer has a thickness of between about 300 Angstroms and 1,000 Angstroms.

5. The method according to claim 2 wherein said step of treating said tungsten layer to form said tungsten nitride layer is by exposing the wafer to a nitrogen ($N_2$) plasma.

6. The method according to claim 2 wherein said tungsten nitride layer has a thickness of between about 50 Angstroms and 200 Angstroms.

7. The method according to claim 1 wherein said step of forming said encapsulation layer comprises selectively depositing a tungsten nitride layer overlying said copper interconnects.

8. The method according to claim 7 wherein said step of depositing a tungsten nitride layer is by chemical vapor deposition (CVD) using a $WF_6$ partial pressure of between about 5 milliTorr and 20 milliTorr, a nitrogen partial pressure of between about 5 milliTorr and 20 milliTorr, a total pressure of between about 50 milliTorr and 200 milliTorr, and a temperature of between about 200 degrees C. and 400 degrees C.

9. The method according to claim 7 wherein said tungsten nitride layer has a thickness of between about 300 Angstroms and 1,000 Angstroms.

10. A method to form copper interconnects in the fabrication of an integrated circuit device comprising:

providing a semiconductor substrate;

providing conductive traces overlying said semiconductor substrate;

depositing a first intermetal dielectric layer overlying said conductive traces;

etching interconnect trenches through said first intermetal dielectric layer to said underlying conductive traces;

depositing a barrier layer overlying said first intermetal dielectric layer and exposed said conductive traces;

depositing a copper layer overlying said barrier layer and filling said interconnect trenches;

polishing away said copper layer and said barrier layer to the top surface of said first intermetal dielectric layer and thereby defining copper interconnects;

selectively depositing a tungsten layer overlying said copper interconnects wherein said tungsten layer is not deposited overlying said first intermetal interconnect layer;

treating said tungsten layer to form a tungsten nitride layer and thereby forming an encapsulation layer;

depositing a second intermetal dielectric layer overlying said first intermetal dielectric layer and said encapsulation layer; and completing the fabrication of the integrated circuit device.

11. The method according to claim 10 wherein said first dielectric layer is fluorinated silicate glass.

12. The method according to claim 10 wherein said step of depositing said tungsten layer is by chemical vapor deposition (CVD) using a $WF_6$ partial pressure of between about 5 milliTorr and 20 milliTorr, a total pressure of between about 50 milliTorr and 200 milliTorr, and a temperature of between about 200 degrees C. and 400 degrees C.

13. The method according to claim 10 wherein said tungsten layer has a thickness of between about 300 Angstroms and 1,000 Angstroms.

14. The method according to claim 10 wherein said step of treating said tungsten layer to form said tungsten nitride layer is by exposing the wafer to a nitrogen ($N_2$) plasma.

15. The method according to claim 10 wherein said tungsten nitride layer has a thickness of between about 50 Angstroms and 200 Angstroms.

16. A method to form copper interconnects in the fabrication of an integrated circuit device comprising:

providing a semiconductor substrate;

providing conductive traces overlying said semiconductor substrate;

depositing a first intermetal dielectric layer overlying said conductive traces;

etching interconnect trenches through said first intermetal dielectric layer to said underlying conductive traces;

depositing a barrier layer overlying said first intermetal dielectric layer and exposed said conductive traces;

depositing a copper layer overlying said barrier layer and filling said interconnect trenches;

polishing away said copper layer and said barrier layer to the top surface of said first intermetal dielectric layer and thereby defining copper interconnects; selectively depositing a tungsten nitride layer overlying said copper interconnects and thereby forming an encapsulation layer wherein said tungsten nitride layer is not deposited overlying said first intermetal interconnect layer;

depositing a second intermetal dielectric layer overlying said first intermetal dielectric layer and said encapsulation layer; and completing the fabrication of the integrated circuit device.

17. The method according to claim 16 wherein said first dielectric layer is fluorinated silicate glass.

18. The method according to claim 16 wherein said step of depositing a tungsten nitride layer is by chemical vapor deposition (CVD) using a $WF_6$ partial pressure of between about 5 milliTorr and 20 milliTorr, a nitrogen partial pressure of between about 5 milliTorr and 20 milliTorr, a total pressure of between about 50 milliTorr and 200 milliTorr, and a temperature of between about 200 degrees C. and 400 degrees C.

19. The method according to claim 16 wherein said tungsten nitride layer has a thickness of between about 50 Angstroms and 200 Angstroms.

20. The method according to claim 16 wherein said barrier layer is one of the group comprised of: tantalum, titanium, tungsten, titanium nitride, tantalum nitride, and tungsten nitride.

* * * * *